United States Patent
Bierly et al.

(10) Patent No.: US 6,421,372 B1
(45) Date of Patent: Jul. 16, 2002

(54) SEQUENTIAL-ACQUISITION, MULTI-BAND, MULTI-CHANNEL, MATCHED FILTER

(75) Inventors: Scott Bierly, Oak Hill; Marc Harlacher, Herndon, both of VA (US); Aaron Weinberg, Potomac, MD (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/707,909

(22) Filed: Nov. 8, 2000

Related U.S. Application Data (60) Provisional application No. 60/164,612, filed on Nov. 10, 1999.

(51) Int. Cl.[7] .............................................. H04L 27/30
(52) U.S. Cl. ...................... 375/143; 375/152; 375/260; 375/343; 370/335; 370/336; 370/441; 370/442
(58) Field of Search .................................. 375/130, 140, 375/142, 143, 144, 147, 150, 152, 343, 347, 349, 260, 326; 370/335, 336, 342, 343, 441, 442, 319, 320, 321

(56) References Cited

U.S. PATENT DOCUMENTS

| | | | | |
|---|---|---|---|---|
| 5,202,903 A | * | 4/1993 | Okanoue | 375/100 |
| 5,420,593 A | | 5/1995 | Niles | 342/357 |
| 5,471,509 A | | 11/1995 | Wood et al. | 375/350 |
| 5,528,624 A | | 6/1996 | Kaku et al. | 375/206 |
| 5,572,216 A | | 11/1996 | Weinberg et al. | 342/357 |
| 5,627,855 A | | 5/1997 | Davidovici | 375/207 |
| 5,638,362 A | | 6/1997 | Dohi et al. | 370/342 |
| 5,654,980 A | * | 8/1997 | Latva-aho et al. | 375/208 |
| 5,764,187 A | | 6/1998 | Rudish et al. | 342/372 |
| 5,781,584 A | | 7/1998 | Zhou et al. | 375/207 |
| 5,793,796 A | | 8/1998 | Hulbert et al. | 375/206 |
| 5,844,951 A | * | 12/1998 | Proakis et al. | 375/347 |
| 5,872,808 A | | 2/1999 | Davidovici et al. | 375/207 |
| 5,901,171 A | | 5/1999 | Kohli et al. | 375/200 |
| 5,910,948 A | * | 6/1999 | Shou et al. | 370/335 |
| 5,933,446 A | * | 8/1999 | Bond et al. | 375/200 |
| 5,943,010 A | | 8/1999 | Rudish et al. | 342/372 |
| 6,052,085 A | | 4/2000 | Hanson et al. | 342/373 |
| 6,075,793 A | * | 6/2000 | Schilling et al. | 370/441 |
| 6,160,803 A | * | 12/2000 | Yuen et al. | 370/342 |

* cited by examiner

Primary Examiner—Stephen Chin
Assistant Examiner—Dac V. Ha
(74) Attorney, Agent, or Firm—Jim Zegeer (57) ABSTRACT

A parallel digital matched filter is constructed which performs numerous simultaneous correlations of a received spread spectrum signal against various replica offsets of its spreading sequence. This allows for the rapid acquisition of the received signal code phase, and subsequent handoff to tracking for a multi-channel receiver. A novel matched filter computational architecture is utilized, in which common digital arithmetic elements are used for both acquisition and tracking purposes. As each channel is sequentially acquired by the parallel matched filter, a subset of the arithmetic elements are then dedicated to the subsequent tracking of that channel. This process is repeated, with the remaining available arithmetic elements accelerating the acquisition of the next channel, and so on, until all resources are allocated as tracking channels. Additionally, multiple data inputs and delay lines are present in this architecture, and are available for processing at each arithmetic element. In this way, multiple signal bands and user channels may be integrated within a common receiver framework.

14 Claims, 6 Drawing Sheets

Figure 2. - RAM-Based Slice Architecture For Low Sampling Rates (example: B=2)

Figure 3. Register-Based Slice Architecture for High Sampling Rates (example: B=2)

Figure 4. PN Chip-Shaping Interpolator Concept (Example with 3-taps)

Figure 5. Example 6-Channel, 32-Bit, up to 2048 length, I/Q, RAM-based PN-Code Generator Figure 6. Example Multi-Channel PN-Matched Filter Acquisition & Tracking Process

SEQUENTIAL-ACQUISITION, MULTI-BAND, MULTI-CHANNEL, MATCHED FILTER

REFERENCE TO RELATED APPLICATION

The present application is the subject of Provisional Application No. 60/164,612 filed Nov. 10, 1999 entitled SEQUENTIAL-ACQUISITION, MULTI-BAND MULTI-CHANNEL, MATCHED FILTER.

Weinberg et al application Ser. No. 09/382,202, filed Aug. 23, 1999 entitled MULTI-BAND, MULTI-FUNCTION INTEGRATED TRANSCEIVER, which is incorporated herein by reference.

BACKGROUND OF THE INVENTION

1. Field of the Invention

This invention relates in general to wireless communication receivers. In particular, it relates to the integration of multiple signal types (CDMA, FDMA, CW, etc.), from multiple bands, with each band and signal type potentially containing multiple user channels, and a single receiver processing architecture for sequentially acquiring, and simultaneously demodulating these multiple channels.

2. Description of the Prior Art

A matched-filter is typically employed in a spread-spectrum demodulator to remove the effects of PN-spreading and allow the carrier and modulating information to be recovered. The digital implementation of a matched filter can be expressed as an integrate-and-dump correlation process, which is of relatively modest computational burden during signal tracking and demodulation. However, it is computationally and/or time intensive to acquire such a signal, where many such correlations must be performed to achieve synchronization with the transmitted spreading sequence. For each potential code-phase offset to be searched (which typically number in the thousands), sufficient samples must be. correlated to ensure that the integrated SNR is sufficient for detection. Performed one at a time, acquisition could easily take several minutes to achieve in typical applications.

For applications requiring rapid signal acquisition (i.e., seconds), a highly parallel matched-filter structure may be used to search many spreading code offsets simultaneously. Typically; this computationally expensive apparatus would be underutilized once acquisition is completed, during the much less demanding tracking operation. If the same parallel matched filter is also used for tracking purposes, only perhaps three of its numerous correlation branches (typically hundreds) are useful in this instance. Alternatively, it may be simpler to use a separate set of early, on-time, and late integrate-and-dump correlators to take over once acquisition is complete; in this case, the parallel matched filter would go completely unused during tracking.

In implementations evidenced by the prior art, the solution has generally fallen into one of several classes:
1. Slow acquisition by sequential traversal of the search space using only the hardware required for tracking a signal; dedicated hardware per channel.
2. Rapid acquisition by parallel traversal of the search space using a dedicated parallel matched filter, which is idle or shut down when dedicated tracking hardware takes over; dedicated hardware per channel.
3. Either class 1 or 2, but multi-band and/or multi-channel, using a loosely integrated but disparate collection of individual processing resources.

REFERENCES CITED

U.S. Patent Documents

| | | |
|---|---|---|
| 5,420,593 | 5/1995 | Niles |
| 5,471,509 | 11/1995 | Wood et al. |
| 5,528,624 | 6/1996 | Kaku et al. |
| 5,572,216 | 11/1996 | Weinberg et al. |
| 5,627,855 | 5/1997 | Davidovici |
| 5,638,362 | 6/1997 | Dohi et al. |
| 5,781,584 | 7/1998 | Zhou et al. |
| 5,793,796 | 8/1998 | Hulbert et al. |
| 5,872,808 | 2/1999 | Davidovici et al. |
| 5,901,171 | 5/1999 | Kohli et al. |

SUMMARY OF THE INVENTION

The present invention provides several new approaches to achieve rapid acquisition in a multi-band, multi-channel signal environment, by sharing a homogeneous collection of digital processing elements. This is done, in part, by taking maximum advantage of the computational commonality between the acquisition and tracking correlation processes. Furthermore, the mismatch in computational demand between acquisition and tracking is-exploited by creating a multi-channel, multi-band integrated receiver. Since only a small percentage of the computational resources are consumed by tracking an individual channel, the remaining resources may be employed to accelerate the acquisition of additional channels. As more resources become dedicated to tracking, fewer remain for acquisition; this has the effect of gradually reducing the number of parallel code offsets that can be searched, gradually increasing acquisition time. In many applications, such as a GPS receiver, this is quite acceptable, as. generally additional channels beyond the first four are less urgent, and are used primarily for position refinement, and back-up signals in the event that a channel is dropped.

In the first aspect of the present invention, the multi-datapath receiver architecture allows independent automatic-gain control (AGC) between multiple input bands, minimizing inter-band interference, and avoiding additive noise compared to schemes that combine the B bands into a single signal and data stream.

To accomplish this, the present invention efficiently processes B streams of W-bit complex sampled data, so that multi-band receiver signals can be kept spectrally separated. This concept can be implemented using B data storage paths shifting at the data sampling rate ($F_{samp}$), or can alternatively be implemented by multiplexing the B streams onto B/k data storage paths each shifting at $k*F_{samp}$.

In another aspect of the present invention, the parallel acquisition correlator, or matched-filter, aids in rapid pseudo-noise (PN)-acquisition by simultaneously searching numerous possible PN-code alignments, as compared with a less compute-intensive sequential search. Multiple channels of data may be co-resident in each band and sampled data stream using Code Division Multiple Access (CDMA) techniques, and multiple bands and sampled data streams share the common computation hardware in the Correlator. In this way, a versatile, multi-channel receiver is realized in a hardware-efficient manner by time-sequencing the available resources to process the multiple signals resident in the data shift registers simultaneously.

In still another aspect of the present invention, the matched filter is organized. into N "Slices" of M-stages, each of which can accept a code phase hand-off the from the PN-Acquisition Correlator and become a PN-tracking de-spreader by providing separate outputs for early, on-time, and late correlations (with spacing depending on the sampling rate; typically half a chip). Slices are handed-off for tracking in the same direction as data flows, and correlation reference coefficients, are shifted (for instance, left to right)—this permits shifting data to be simultaneously available for the leftmost Slices that are using the data for tracking, and rightmost Slices that are using the data for acquisition. Each slice can choose between using and shifting the acquisition reference coefficient stream to the right, or accepting the handoff of the previous acquisition reference coefficient stream and using it to track the acquired signal.

In still another aspect of the present invention, the Acquisition correlator can integrate across all available Slices to produce a single combined output, or the individual Slice integrations can be selectively output for post-processing in the case of high residual carrier offsets or high-symbol rates, where the entire N*M-stage correlator width cannot be directly combined without encountering an integration cancellation effect.

In yet another aspect, the present invention embodies a Scaleable Acquisition Correlator, which when tracking a maximum of G independent signals, can use the remaining N-G Slices to search for new signals, or for fast re-acquisition of dropped signals. Initially, Slices will be allocated sequentially (for instance, from left to right), but after running for some time, with signals alternately being acquired and dropped, the Slice allocation will most likely become fragmented, resulting in inefficient use of the Acquisition Correlator. This can be resolved by implementing a de-fragmentation algorithm that swaps tracking Slices around dynamically to maximize the number of contiguous rightmost Slices, and thus optimize Acquisition. A global mask allows setting arbitrary width of the Acquisition Correlator.

In another aspect, the present invention contains G independent numerically-controlled oscillator (NCO)-based PN-Code Generators with almost arbitrary code rate tracking resolution (for example, better than 0.0007 Hertz for 32-bit NCO at 3 Mcps). All NCO's run using a single reference clock which is the same clock that is used for all signal processing in the Matched-Filter. Ultra-precise tracking PN Code phase is maintained in the G independent phase accumulators. Multi-channel NCOs are efficiently implemented by sharing computational resources and implementing phase accumulation registers in RAM, for the case when the processing rate is in excess of the required NCO sampling rate.

In still another aspect of the present invention, the PN-Code Generators use L-by-2 random-access memory (RAM) look-up tables for independent in-phase/quadrature (I/Q) code generation, using length-L arbitrary code sequences. Depending on the size of available RAM blocks, and whether the NCO sampling rate is less than the available processing rate, either one RAM block per channel is required to store the PN-sequence, or RAM blocks could be shared between two or more channels.

In still another aspect of the present invention, a RAM-based architecture exploits high-density implementation in field-programmable gate-arrays (FPGAS) and application-specific integrated circuits (ASICs) by taking advantage of processing rates ($F_{proc}$) much greater than the data sampling rate ($F_{samp}$). RAM is used for all data shift-registers, Code Generators, and NCOs for efficient hardware utilization; furthermore, due to the processing rate being greater than the data sampling rate, less computation hardware is required, and can be shared to satisfy the needs of multiple stages (basically, reduced according to $F_{samp}/F_{proc}$).

In another aspect of the present invention, a register-based architecture variant allows for much higher sampling rates (equal to the processing rate); registers are used for all data shift-registers. It is also possible to implement a hybrid architecture that may utilize any combination of RAM-based and register-based implementations.

A further aspect of the present invention adds a PN Chip-shaping poly-phase interpolation filter utilizing precisely known PN Code Phase, in conjunction with known past, present, and future PN sequence, in conjunction with anticipated transmitted spectral shaping characteristics, to shape the Matched Filter reference waveform to more closely match the distortions of the incoming signal. This reduces correlator implementation loss due to asynchronous sampling of the received signal and single-bit quantization of the reference waveform, particularly for the case of tapping only a single sample per chip.

In yet another aspect, the present invention allocates 4 or more Channels, and one Band, to receiving GPS signals and thus deriving periodic time and position calculations, and then utilizing the remaining receiver resources to process another signal of perhaps primary interest. The precise derivation of time, and therefore frequency, from the GPS allows the frequency error inherent to the local reference oscillator to be measured and corrected (to a level approaching the accuracy of the GPS ground station reference over long periods), thus having the potential of significantly improving the receiver performance with regard to the primary signal of interest.

DETAILED DESCRIPTION OF THE PREFERRED EMBODIMENTS

The first aspect of the preferred embodiment relates to the implementation of multiple channel, multiple frequency band receivers. At any given point in time, the state of the art in analog-to-digital conversion (ADC) chips, and subsequent digital signal processing (DSP) technology for performing data demodulation, will allow only a certain amount of frequency spectrum (band) to be digitized into a single data stream. Within that band, multiple user channels can coexist using various-well known multiple-access techniques such as FDMA, TDMA, CDMA, etc.

When additional channels of interest lie outside of the frequency bandwidth that can be digitized into a single digital band, and simultaneous reception is required from each band, then multiple RF downconverters and ADCs must be used to digitize multiple bands. The present invention allows an arbitrary number of such bands to be processed together in a unified computational engine. In this embodiment, a pool of arithmetic processing resources, or receiver channels, can be applied on a demand access basis to various user signals, regardless of which band they originated in. In this way., an almost arbitrary variety and amount of frequency spectrum can be utilized, and an almost arbitrary number of user channels of varying modulation type can be digitally extracted from it.

There are several advantages of using this technique to present multiple bands to a single receiver structure. Firstly, it is well known that as wider bandwidths containing multiple and various signals are received together, increasing analog signal fidelity requirements are imposed. This is a significant limitation, in that analog circuitry suffers from such problems as intermodulation distortion (IMD), where multiple frequency sources interact to produce distortion components. The present invention optimizes the analog signal fidelity by digitizing processing each band.

Secondly, given an arbitrary RF and ADC dynamic range, it is desirable to use automatic gain control (AGC) to capture the signal of interest within. the available amplitude range of both analog circuitry and A/D converter. As wider bandwidths containing multiple and various signals are digitized together, they must also be subject to a common AGC process, which will be dominated by the largest signals across all bands; this potentially decreases the SNR of the smaller signals, due to A/D quantization noise. The present invention optimizes the AGC process by allowing each band to be treated separately.

Thirdly, other schemes to digitize a composite mix of various frequency bands might use a technique of summing together the signals after translation to adjacent intermediate frequencies. In this type, of scheme, the limitations of the analog circuitry will dictate that additive noise from each of the various RF bands will somewhat degrade the signal-to-noise ratio (SNR) of the resultant composite signal. The present invention optimizes the SNR of each band by maintaining separate RF, IF, and digital signal paths.

Figure 1:
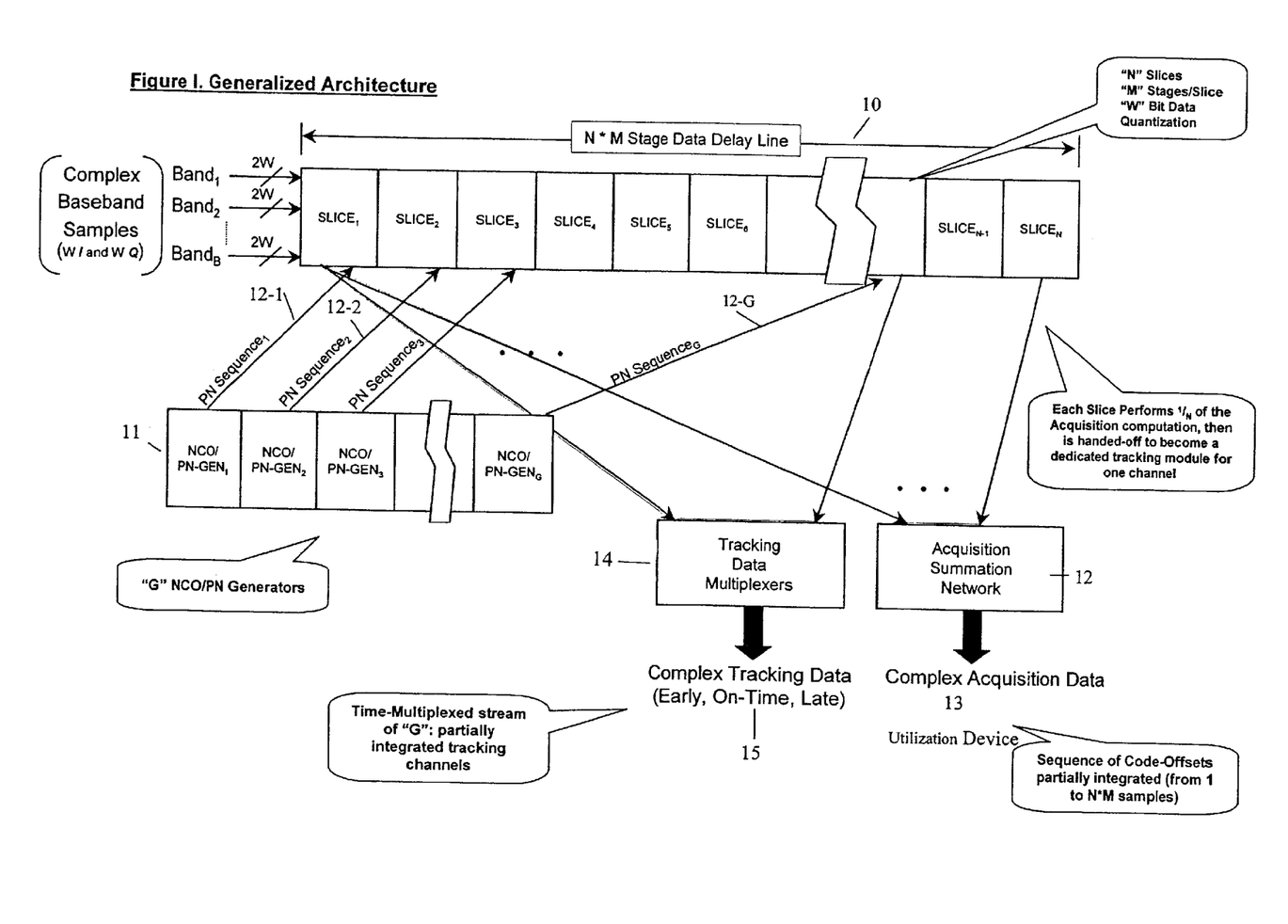
FIG. 1 is a generalized functional block diagram of the multi-channel matched filter architecture, illustrating the multiple input bands, the multiple NCO-based PN Generators, and the division of the parallel matched filter into multiple slices, each of which can form a tracking correlator when not participating in acquisition.

The second aspect of implementing the preferred embodiment relates to the architecture of the flexible computation core of the digital matched filter. The architecture has been designed to satisfy two different driving requirements: acquisition of a single user channel, and tracking of multiple user channels. Referring to FIG. 1, an (N*M) stage data delay line 10 (shown as being embodied by N distinct slices), composed of B distinct bands (Band 1, Band 2 . . . Band B) of 2*W bits each (W bits I, W bits Q complex data), contains a sequence of samples of the bands of interest. It is well known that the sampling rate must be chosen to satisfy the Nyquist criterion to preserve the appropriate signal bandwidth of interest, and to allow sufficient time resolution for acquisition and tracking; generally two or more times the chipping rate for a spread spectrum signal. The data is then shifted through the data delay line 10 at the sampling rate.

For the purposes of acquisition, a single numerically controlled oscillator (NCO) 11 is needed, to serve as a finely controllable digital frequency source matched to the expected chipping rate of. the incoming signal. In conjunction with this, during acquisition a single PN chip generator is needed, to reproduce the chipping sequence of the incoming signal, at the rate dictated by the NCO. This PN Sequence (12-1, 12-2 . . . 12G) is then presented to the leftmost end of the data delay line (to the leftmost slice), where it is also shifted from left to right down a PN Sequence delay line (shown in more detail in FIG. 2 and FIG. 3). At appropriate time intervals, the state of the PN Sequence delay line is latched into a reference correlation register. The computational logic within the slices then performs a correlation of the latched reference PN Sequence against the samples contained in the data delay line 10.

Figure 2:
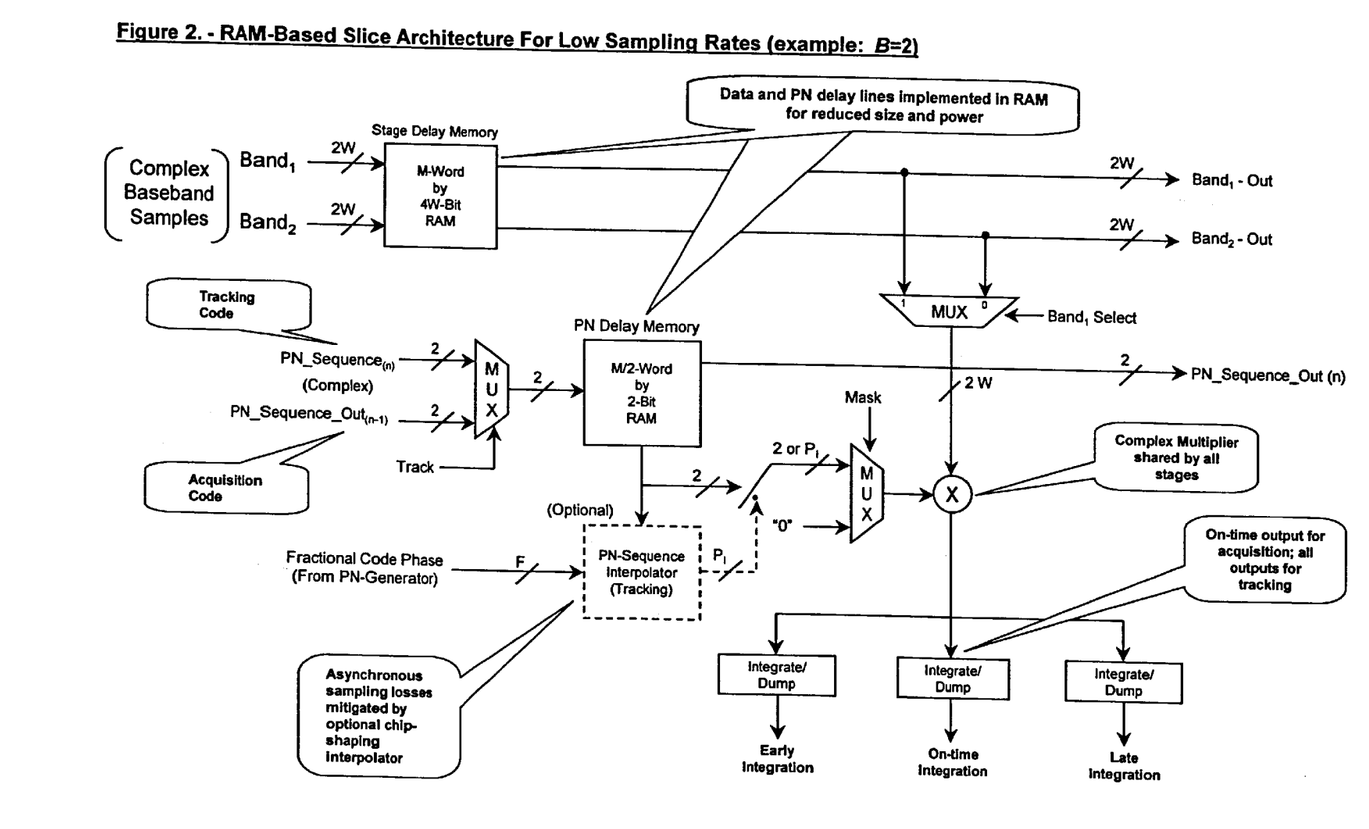
FIG. 2 is a functional block diagram of a specific embodiment of the slice architecture, in which RAM structures are utilized to form highly efficient data storage cells, for the case of relatively low sampling rates; note that a single computation element is shared by all stages.
Figure 3:
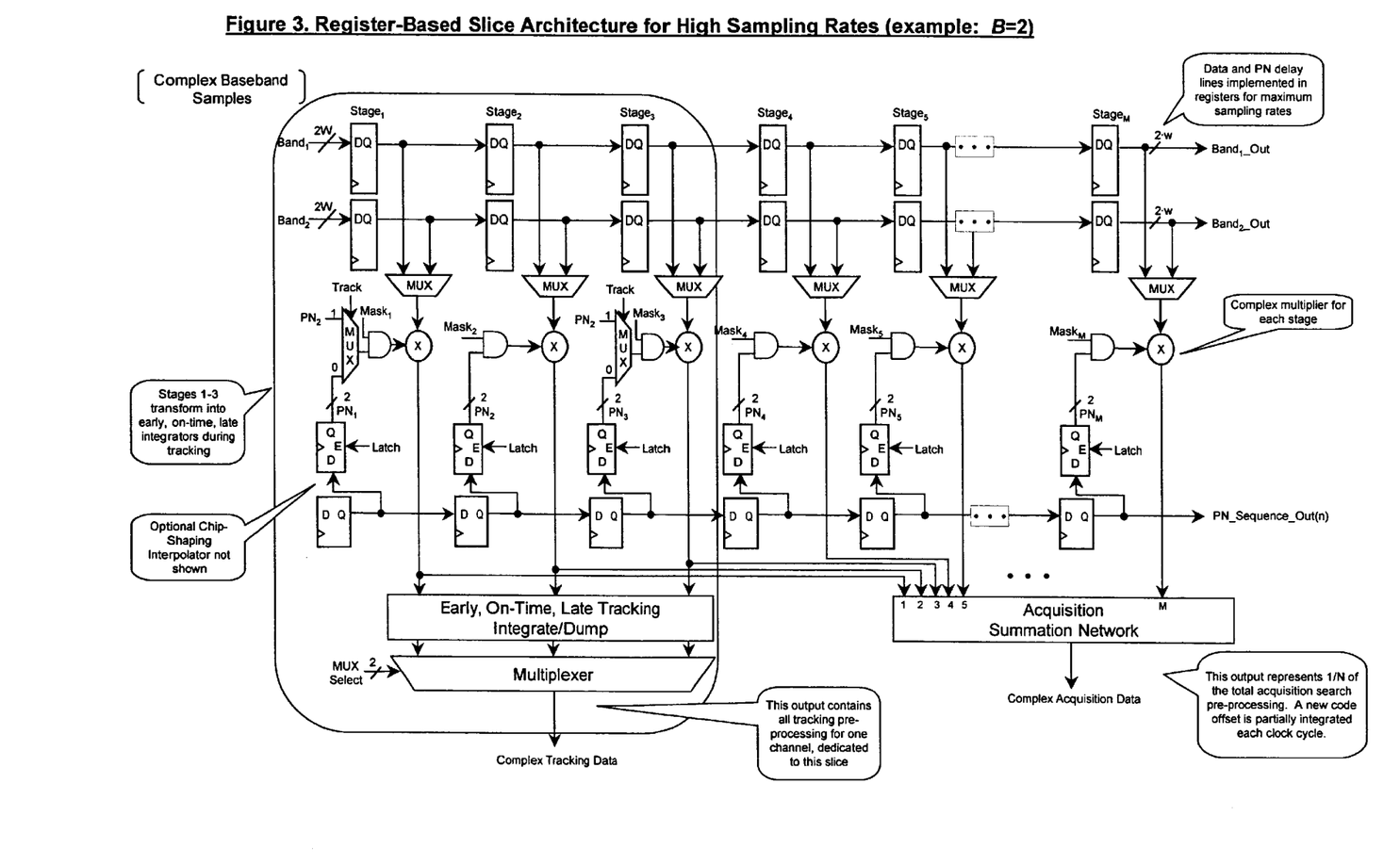
FIG. 3 is a functional block diagram of a specific embodiment of the slice architecture, in which register structures are utilized to form data storage cells, for the case of relatively high sampling rates; note that each tapped stage requires a computational element.

For each sample time, up to (N*M) multiplications are performed of each data sample with its corresponding reference PN chip (in some applications, the stages are decimated prior to performing the correlation, so that not all are tapped for computation); all of these products are then summed into a single partial correlation value by the Acquisition Summation Network 12 shown in FIGS. 1–3, which is then passed on to a subsequent processing or utilization circuit 13 for further integration and detection thresholding (this post processing is not described here). Because the data samples are shifted by one position at each sample time, and the latched reference PN sequence is held in the same position over a period of time (update period), each sequential partial correlation within a given update period represents a different potential alignment (code offset) between the reference PN sequence and the received signal. In this way, over time a correlation is performed for all possible code offsets, to within the nearest fraction of a chip defined by the chosen sampling rate; the timing of the latch update period, and the NCO/PN-Generator code phase, are carefully controlled to determine the specific offset search sequence. The post-processing circuit can perform additional integrations for each code offset to achieve sufficient SNR to enable detection of the correct offset.

At this point, the receiver can be said to have completed PN acquisition, and the matched filter is able to go into PN tracking mode. During tracking in tracking data multiplexor 14, the problem is substantially easier. If there were no phase or frequency drift present, only the single correctly aligned correlation sequence must be computed; that would be a single multiply and sum per input sample. Since there are phase and frequency drifts (i.e., the reference NCO frequency setting becomes incorrect over time; this is a function of the loop filter order) in typical applications, two additional correlations must be computed as well, corresponding to the code offsets that are slightly early and slightly late, with respect to the currently tracked (on-time) code offset. These correlations allow the phase and frequency drift to be observed and tracked with the NCO, using well known PN tracking loop techniques. The early, on-time, and late correlations (or partial correlations) are output 14 via a separate signal path to the post processing circuitry (this post processing is not described here) So, where (N*M) multiplies and sums must be computed for each input sample during acquisition, only 3 multiply/sums must be computed for each sample during tracking. Since there is motivation to choose (N*M) to be as large as possible for rapid acquisition, this leaves a substantial surplus of computational horsepower idle during tracking.

Thus, the primary nature of the second aspect of implementing the present invention lies in the agility of the computational structure in transitioning, one slice at a time, from being part of an acquisition correlation process as described above, to being part of a tracking correlation process as described above. This also involves adding additional NCO/PN-Generator pairs 11 corresponding to the desired number of channels (shown as G in FIG. 1) to be simultaneously tracked. Each of these creates a unique PN Sequence, at unique chipping rates, and presents them to unique slices, from left to right, as shown in FIG. 1.

Figure 6:
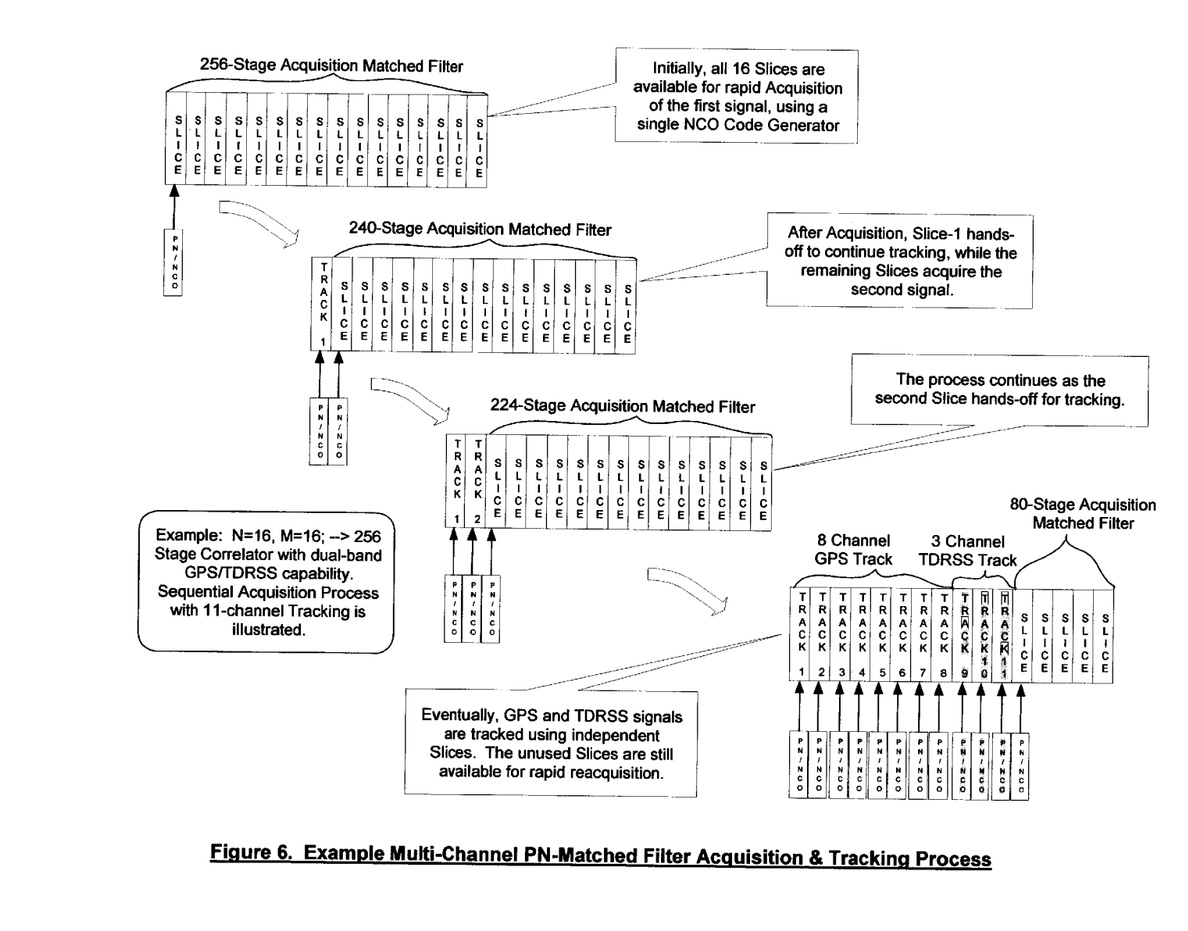
FIG. 6 illustrates the overall process of sequential acquisition and handoff to tracking in the matched filter, using an example embodiment and a time sequence of resource allocation diagrams.

Each combination of NCO/PN-Generator and slice (matched up from left-to-right) form the required computational capability for tracking a single user signal. The rightmost unused NCO/PN-Generator pair, and all rightmost unused slices, form the available computational capability for acquiring a new user signal. The amount of time required to acquire the new signal depends on the number of correlation stages available, because that determines the number of correlation samples that are integrated at each sample time. All of this computation, for acquisition and tracking of multiple channels, happens concurrently using the flexible computation resources, and occurs transparently with respect to the multiple bands of sampled data that constantly stream through the data delay lines. This entire process is illustrated in FIG. 6.

The third aspect of implementing the preferred embodiment relates to the partial acquisition integration method. For the problem of PN Acquisition, it would be ideal to integrate an arbitrary number of correlation samples until the appropriate SNR level is reached. However, this cannot be done in the presence of residual carrier components due to unknown doppler and other frequency offsets, which would cause integrations across complete carrier cycles to cancel out. In a similar manner, integrations across multiple data symbol transitions can potentially cancel out as well. These effects limit the useful size of the acquisition matched filter, and would normally force much of the computational capabilities to go unused (through masking-out of that portion of the filter which exceeds the appropriate integration length). This problem is mitigated in the present invention by allowing the individual slice partial integrations to be output to the post-processing circuitry. Various methods can be used to combine the partial integrations into a complete integration without suffering from the cancellation effects.

In a fourth aspect of the present invention, the preferred embodiment employs a defragmentation algorithm to ensure that the maximum acquisition capability is maintained over time. The manner of sequential acquisition and, from left to right in FIG. 1, allocation of slices for tracking has been described. In that initial context, the rightmost slices are always optimally utilized for acquisition; none are wasted. However, as signals are dropped in a multiple channel tracking environment, holes will develop where middle slices are no longer tracking, but cannot participate in acquisition in the normal fashion due to isolation from the rightmost slices.

This problem is mitigated in the present invention by swapping out tracking slices from right to left in order to maintain contiguous unused rightmost slices for acquisition. This is done by initializing the NCO/PN-Generator of the unused (left) slice to run in offset-synchronism with the currently tracking (right) slice that is to be moved; offset, in the sense that chipping frequency is identical, but code phase is advanced by an appropriate amount to correspond with the relative difference in received signal phase at the two slices. In units of time, this is basically the number of delay stages of offset between the two slices, divided by the sampling rate. At the known chipping rate, this is easily converted to a code offset. After the handoff is complete, the process is repeated until all tracking slices are packed to the left.

The fifth aspect of implementing the preferred embodiment involves a method of using a single clocking system, synchronous to the data sampling clock, to generate G independent NCO/PN-Generators that produce PN chipping sequences whose average rates can very precisely track the various received signal chipping rates. Also, if the NCO processing clock is in excess of the required NCO sampling rate, efficient RAM state storage and code phase computational hardware can be time-shared for reduced hardware size. A block diagram of this concept is shown in FIG. 5.

Because each NCO is operating at the NCO sampling rate (perhaps equal to the data sampling rate), it can only make a decision to advance to the next chip at those coarse sampling intervals. Thus, even though the NCO phase accumulator knows when to advance to the next chip to within fractions of a sampling interval, it must incorrectly wait until the end of the sampling interval to do so. However, this chip-jitter averages out in the long term (as long as the NCO sampling rate is asynchronous to the chipping rate); furthermore, because the NCO clocks are all synchronous to the data sampling clocks, the jitter exactly reflects the effective jitter that will be contained in the received chip transitions. In other words, both the incoming signal code phase, and the internal accumulated code phase will track very precisely; since they are both asynchronously sampled by data/NCO sampling clock, a common phase jitter will be superimposed onto both, such that the jitter itself causes no additional processing loss.

Figure 5:
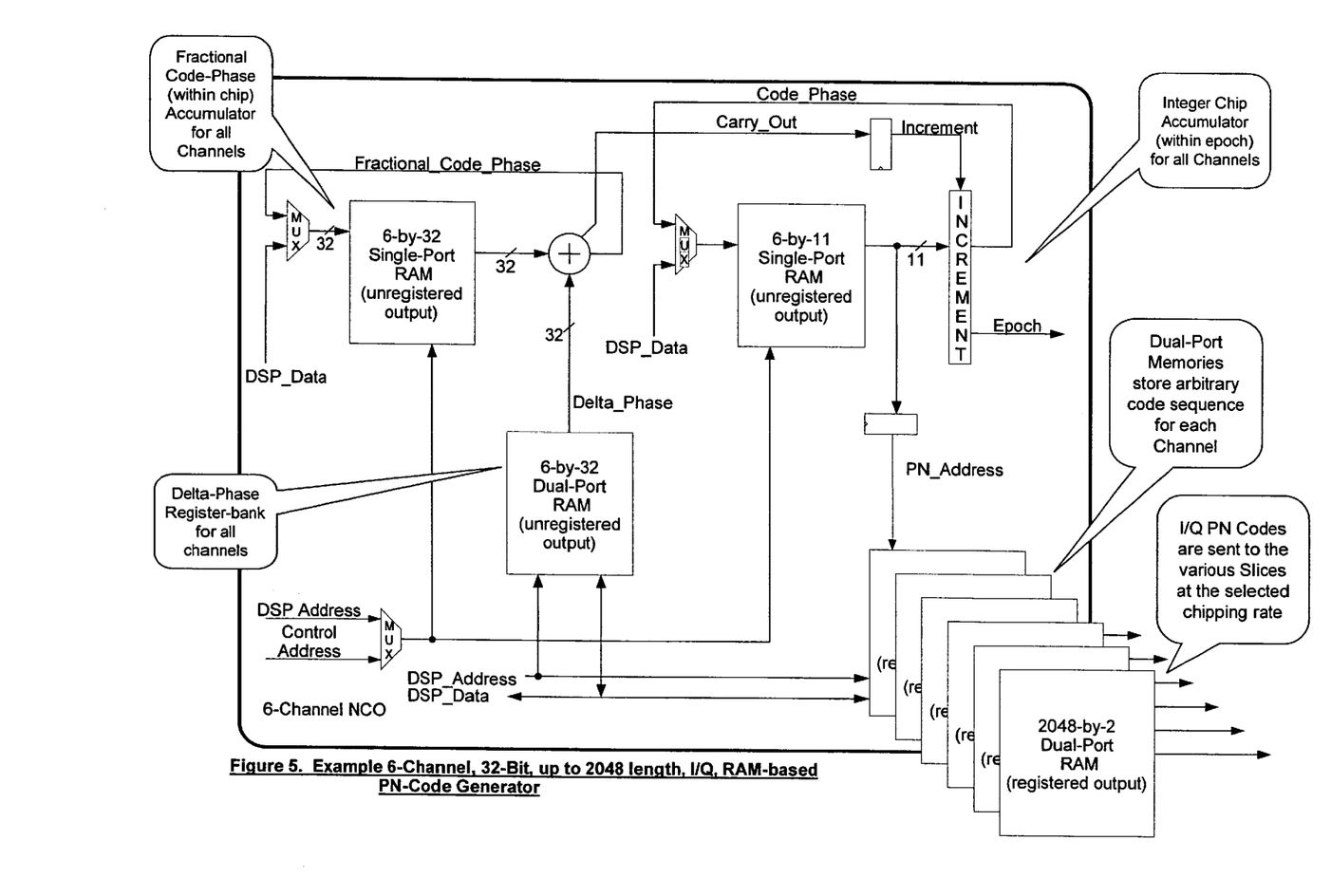
FIG. 5 is a functional block diagram showing an example embodiment of the multi-channel, NCO-driven, PN code generator, using efficient RAM-based state machines.

FIG. 5 shows an example implementation of the RAM-based PN-code generator. In this example, it is assumed that the processing clock is at least 6 times the desired NCO sampling rate. So, within the time of each NCO sampling interval, the computational resources may be cycled 6 times to produce new code phases and PN chips for each of 6 channels. This allows, for example, a single adder to compute for 6 phase accumulators. The six fractional and integer code phases are stored in RAM storage cells, and can be retrieved sequentially for processing. The new code phases are then sequentially updated back into the RAMs. Also, in this example, RAM is utilized to store the entire PN sequence for each channel. Thus, arbitrary sequences can be generated, and the phase accumulator circuitry merely plays back the chips at the correct rate. Alternatively, specific PN sequence generators could be constructed, with a slight modification of the indicated block diagram.

The sixth aspect of, implementing the preferred embodiment involves the RAM based Slice architecture for low sampling rates. Referring to FIG. 2, it can be seen that the B-band, M-stage delay line that must be implemented for each slice can be implemented using an M-word by (B)*(2*W)-bit RAM block (B=2 in FIG. 2). In a similar fashion to the timesharing technique described for the NCO/PN-Generators, the availability of a processing clock sufficiently in excess of the data sampling clock allows this space-optimized architecture to be used.

At each sample time, the following demands are placed on the Stage Delay Memory in the slice during acquisition mode:

1. For each data delay stage to be tapped for correlation (typically M or M/2), a read cycle must take place.
2. The outgoing sample of all B bands (that is to be shifted into the slice to the right) requires a read cycle.

3. The incoming sample of all B bands requires a single write cycle to replace the outgoing sample from step 2.

The processing clock must be sufficiently faster than the data sampling clock to allow these operations to take place; the exact amount depends on specific implementation details, such as use of single vs. dual-port RAM, ability to overlap steps 2 and 3, etc. A slice controller contains an address sequencer to manage the flow of data to and from the memory. During tracking mode, steps 2 and 3 above are the same; step 1, however, is simplified to require only 1 to 3 correlation reads, depending upon the algorithm used.

In a similar manner, the PN sequence delay stages, and latch, are implemented using a RAM block (typically M or M/2 words by 1 or 2 bits). Depending-on whether the slice is being used for acquisition or tracking, the source of the incoming chips is either the previous slice or the NCO/PN Generator that is hard-wired to that slice, respectively. Once again, a flexible slice controller generates the address sequencing needed to manage the flow of chips into and out of the PN Delay Memory. In this it case, the Memory is emulating both the chip delay shift register, and the latch, all within the same RAM structure.

With regard to the, specific sequence of reads and writes at the PN Delay Memory, all three steps are identical to those of the Stage Delay Memory described above for acquisition; for tracking, steps 2 and 3 are identical, but step 1 is simplified to require only 1 to 3 correlation reads, depending upon the algorithm used (3 reads are performed for either the Stage Delay Memory, or the PN Delay Memory; the other Memory requires only 1 read). In tracking mode, the slice is only computationally active for the first 3 processing clock cycles (pipelining may occupy additional cycles; also, the data shift register continues to operate for the benefit of the downstream slices in tracking or acquisition); this feature allows lower power consumption during tracking.

The RAM based architecture for low sampling rates is efficient for two reasons: firstly, the savings in storage due to use of RAMs instead of registers; secondly, because all the computational processing is timeshared using a faster processing clock. Due to this second concept, each slice only requires a single multiplier resource that sequences through all the correlation operations. For acquisition, that multiplier feeds a single (on-time) integrate-and-dump unit that sums all the correlation products for the M stages of each slice, and passes those partial correlation results forward to the post-processing circuitry.

For tracking, each slice is actually performing three concurrent correlations, and utilizes three integrate-and-dump units that produce the early, on-time, and late correlations. Since each slice is independently responsible for tracking a given channel, the entire data symbol integration could take place within the slice before being output; this would result in a variable dump rate which depended on the symbol rate. Alternatively, a constant dump rate could be chosen to simplify communication with the post-processor; this would result in all tracking slices integrating a fixed number of sample correlation products.

In a seventh aspect of implementing the preferred embodiment, a register-based slice architecture will be described that is better suited for high sampling rate cases. Referring to FIG. 3, it can be seen that the B-band, M-stage delay line that must be implemented for each slice can be implemented. using an $(M)*(B)*(2*W)$-bit array of register cells (B=2 in FIG. 3). The functionality of the data shift register is identical to that of the RAM architecture, except that now actual discrete flip-flop cells are physically connected into a shift register configuration. This has the advantage of permitting data sampling rates that are as high as the processing clock rate. Similarly, the PN sequence delay stages, and latch, are implemented using actual register cells, wired in an appropriate configuration.(see FIG. 3).

In acquisition mode, the slice multiplies each tapped data sample in a stage with the corresponding PN chip sample (all stages are shown as tapped in FIG. 3), and calculates the summation of each of those products, as previously described. In tracking mode, only the first three stages of the slice are active computationally (although the data shift register continues to operate for the benefit of the downstream slices in tracking or acquisition); this feature allows for lower power consumption during tracking mode. As shown in FIG. 3, the three samples (phases) of data are all correlated against a common PN code phase (shown as PN stage 2 in FIG. 3, although this is arbitrary). The resultant product sequences represent early, on-time, and late correlations, which are integrated separately in the three integrate/dump circuits, and passed on to the post-processing circuitry.

There are two costs associated with choosing the register slice architecture over the RAM approach: firstly, although the number of storage cells is the same either way, the RAM approach generally leads to a leaner implementation. In an FPGA implementation, resource availability is somewhat fixed, and RAM is significantly more efficient than flip-flops. In an ASIC implementation, fewer transistors are required to build a RAM cell compared to a flip-flop cell. Secondly, since the data sampling rate can now be equal to the processing rate, the RAM architecture's ability to share computational hardware is forsaken, and so. complexity grows proportionally.

Figure 4:
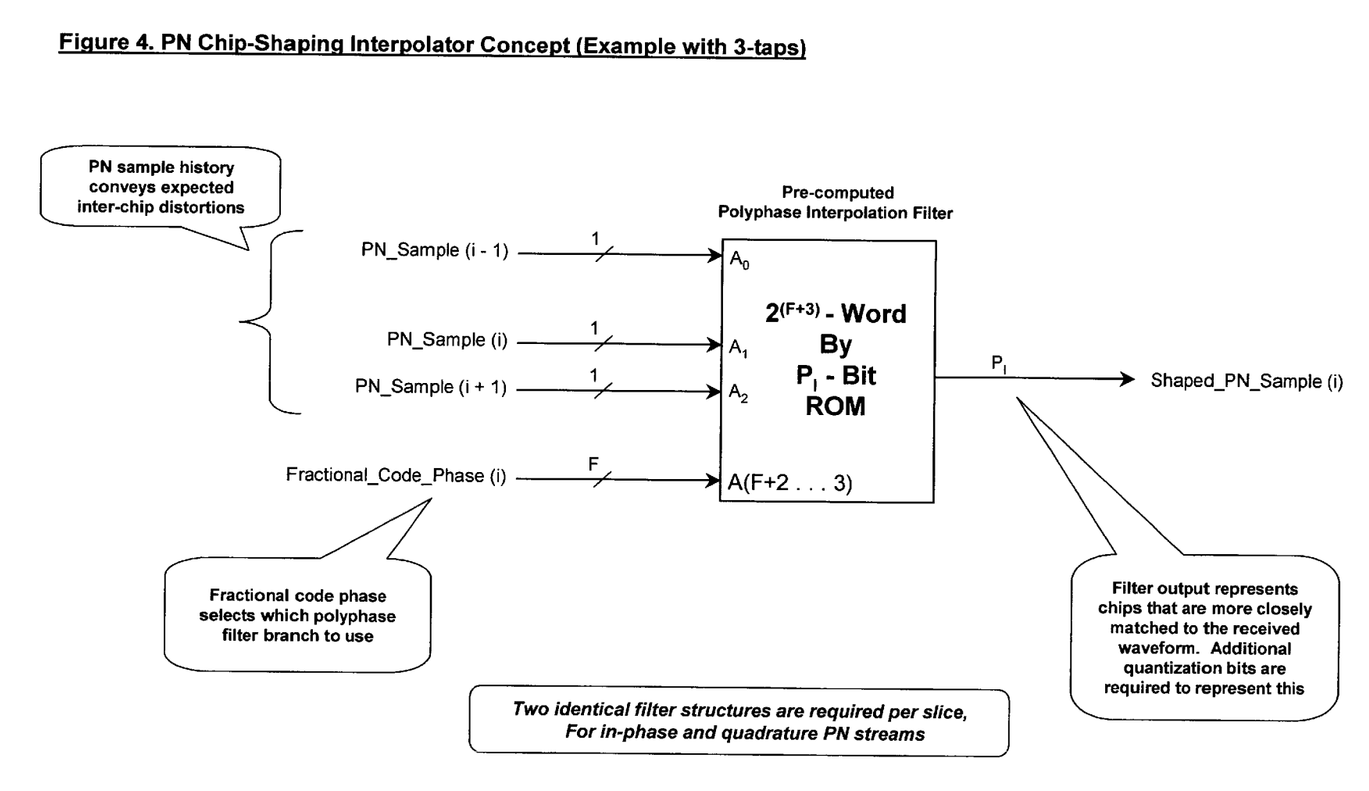
FIG. 4 is a functional block diagram of the PN chip-shaping interpolator concept, which utilizes precise knowledge of fractional code phase and asynchronous chip sampling during tracking to shape the reference correlation waveform to better match the received signal.

The eighth aspect of implementing the preferred embodiment involves the optional chip-shaping interpolation filter. The interpolator serves to reduce the matched filter implementation loss by better matching the reference waveform to the received signal. Initially, the PN Generator will produce a sequence of 1-bit idealized chips, which is the equivalent of an infinite bandwidth representation of the reference waveform. Since substantial pulse-shaping is likely to occur in the transmission channel in most applications, this idealized reference waveform is poorly matched to the received signal. The interpolating filter produces a sequence of shaped, $P_I$-bit reference chips by applying a polyphase FIR filter to the original 1-bit sequence. Using the knowledge of fractional code phase present in the PN NCO fractional phase accumulator, a polyphase filter branch can be chosen to synthesize each point in the resampled sequence. The filter transfer function;can be chosen to best represent the expected transmission channel characteristics.

FIG. 4 shows an example ROM-based (RAM could also be used) implementation of the chip-shaping filter, which looks at a current chip and its two adjacent chips (this minimal implementation should still show a significant improvement over 1-bit chips), as well as F-bits of fractional code phase. A $P_I$-bit interpolated result is produced. The ROM-based filter is shown because it should prove feasible for many applications, particularly if small word sizes are chosen for F and $P_I$ (for instance, 3 bits). For much larger word sizes, actual multiply/accumulate hardware may be necessary, because ROM implementation may prove difficult.

The ninth aspect of implementing the preferred embodiment involves the implementation of a GPS receiver function using 4 or more of the receiver channels (and one band), and using it to discipline the local frequency reference to within the long term accuracy of the GPS system. The specific implementation of a GPS receiver utilizes general spread spectrum receiver techniques, as well as the specific multi-channel receiver techniques already described herein, and should be well known to those in the field. It is also well known that with four or more tracked GPS satellites, the receiver's position is resolved, as well as a very precise measurement of time relative to the NAVSTAR GPS timebase. With the availability of a periodic, precise measure of time in the receiver, the control processor can now measure the frequency accuracy of the local reference oscillator. This is easily done using conventional frequency measurement techniques, such as counting pulses over a period that is well known in terms of GPS time. Alternatively, GPS receiver calculations can directly reveal the amount of error in the local reference.

Once the local oscillator frequency error is measured, a means is provided in the local oscillator design to trim the output frequency based on an analog control voltage. This voltage is then set under software control using various well known techniques, such as using a D/A converter or digital potentiometer. This process forms a control loop, since subsequent measurements will reveal the residual error, or drift, since the last frequency adjustment. Thus, the process will stabilize to one in which the local oscillator drifts within a small frequency window defined by the characteristics of the control loop and of the intrinsic oscillator short-term drift. In the long term, the local oscillator will track the accuracy of the GPS frequency reference itself.

The invention features the following:
1. Multi-band, AGC/dynamic range/interference/noise vs. additive schemes.→multi-data storage, common processing.
2. Parallel matched filter, acquisition Advantages, flexible compute core→also tracks, sequential acquisition, multi-channel concurrent tracking; Slice Architecture, acquisition method, handoff method, tracking method , Global mask
3. Acquisition partial integration method for high symbol rates, high doppler.
4. Scaleable acquisition correlator, de-fragmentation method.
5. Multi-channel NCO/Code Generators, single clocking, efficient RAM multiplexing method; RAM-based PN-Code generators.
6. RAM based Slice architecture for low sampling rates.
7. Register based Slice architecture for high sampling rates.
8. Chip shaping interpolation filter.
9. Integrated GPS corrects reference frequency error, augmenting other integrated receiver bands/channels.

While the invention has been described in relation to preferred embodiments of the invention, it will be appreciated that other embodiments, adaptations and modifications of the invention will be apparent to those skilled in the art.

What is claimed is:

1. A parallel digital matched filter constructed to perform a plurality of simultaneous correlations of a received spread spectrum signal against various replica offsets of its spreading sequence and allows for the rapid acquisition of the received signal code phase, and subsequent handoff to tracking for a multi-channel receiver, comprising matched filter computational architecture in which common digital arithmetic elements are used for both acquisition and tracking purposes, wherein, as each channel is sequentially acquired by said parallel matched filter, a subset of the arithmetic elements are then dedicated to the subsequent tracking of that channel, and this process is repeated, with the remaining available arithmetic elements accelerating the acquisition of the next channel, and so on, until all resources are allocated as tracking channels, and wherein multiple data inputs and delay lines are present, and are available for processing at each arithmetic element, whereby multiple signal bands and user channels are integrated within a common receiver framework, and one or more utilization devices are coupled to said matched filter.

2. A multiple frequency band multiple channel radio receiver comprising:
   front end circuitry for providing complex base band samples for a plurality of frequency bands and multiple channels in the radio spectrum,
   an N*M stage data delay line comprised of a parallel digital matched filter constructed and adapter to perform a plurality of simultaneous correlations of received spread spectrum signals against various replica offsets of a spreading sequence, said parallel digital matched filter providing N slices with M stages per slice and W bit data quantization, each slice being adapted to perform 1/N of the acquisition computation and then is handed off to become a dedicated tracking module for one channel,
   tracking data multiplexers coupled to said N*M stage data delay line for providing time multiplexed streams of G signals which are partially integrated tracking channels providing complex tracking data (early, on time, late) and an acquisition summation network providing complex acquisition data as a sequence of codes offsets partially integrated from one to N*M samples, and
   one or more utilization devices connected to said matched filter, and
   wherein N, M, W, and G are integers.

3. The radio receiver defined in claim 2 wherein said matched filter achieves independent automatic-gain control (AGC) between multiple input bands, minimizing inter-band interference, and avoiding additive noise by processing B streams of W-bit complex sampled data, so that multi-band receiver signals can be kept spectrally separated, including B data storage paths shifting at the data sampling rate ($F_{samp}$), and wherein B is an integer.

4. The radio receiver defined in claim 2 wherein said matched filter achieves independent automatic-gain control (AGC) between multiple input bands, minimizing inter-band interference, and avoiding additive noise by processing B streams of W-bit complex sampled data, so that multi-band receiver signals can be kept spectrally separated, including multiplexing the B streams onto B/k data storage paths each shifting at $k*F_{samp}$, and wherein k is an integer.

5. The receiver defined in claim 3 wherein said matched-filter, aids in rapid pseudo-noise (PN)-acquisition by simultaneously searching numerous possible PN-code alignments and multiple channels of data may be co-resident in each band and sampled data stream using Code Division Multiple Access (CDMA) techniques, and multiple bands and sampled data streams share the common computation hardware in the Correlator wherein a versatile, multi-channel receiver is realized in a hardware-efficient manner by time-sequencing the available resources to process the multiple signals resident in the data shift registers simultaneously.

6. The receiver defined in claim 3 wherein said matched filter is organized into N Slices of M-stages, each of which can accept a code phase hand-off the from the PN-Acquisition Correlator and become a PN-tracking de-spreader by providing separate outputs for early, on-time, and late correlations, with spacing:depending on the sampling rate; typically half a chip and slices are handed-off for tracking in the same direction as data flows, and correlation reference coefficients, are shifted in a predetermined direction to permit shifting data to be simultaneously available for the leftmost Slices that are using the data for tracking, and rightmost Slices that are using the data for acquisition, and each slice can choose between using and shifting the acquisition reference coefficient stream to the right, or accepting the handoff of the previous acquisition reference coefficient stream and using it to track the acquired signal.

7. The radio receiver defined in claim 6 wherein said matched filter is adapted to integrate across all available Slices to produce a single combined output, or the individual Slice integrations can be selectively output for post-processing in the case of high residual carrier offsets or high-symbol rates, where the entire N*M-stage correlator width cannot be directly combined without encountering an integration cancellation effect.

8. The radio receiver defined in claim 3 wherein said matched filter is a Scaleable Acquisition Correlator, which when tracking a maximum of G independent signals, can use the remaining N-G Slices to search for new signals, or for fast re-acquisition of dropped signals, initially, Slices will be allocated sequentially in a predetermined direction, but after running for some time, with signals alternately being acquired and dropped, the Slice allocation will most likely become fragmented, resulting in inefficient use of the Acquisition Correlator, and resolving this by implementing a de-fragmentation algorithm that swaps tracking Slices around dynamically to maximize the number of contiguous rightmost Slices, and thus optimize Acquisition.

9. The invention defined in claim 8 including a global mask allows setting arbitrary width of the Acquisition Correlator.

10. The invention defined in claim 3 wherein said receiver contains G independent numerically-controlled oscillator (NCO)-based PN-Code Generators with almost arbitrary code rate tracking resolution (better than 0.0007 Hertz for 32-bit NCO at 3 Mcps), all said NCO's run using a single reference clock which is the same clock that is used for all signal processing in the Matched-Filter and ultra-precise tracking PN Code phase is maintained in the G independent phase accumulators and multi-channel NCOs are efficiently implemented by sharing computational resources and implementing phase accumulation registers in RAM, for the case when the processing rate is in excess of the required NCO sampling rate.

11. The invention defined in claim 10 wherein said PN-Code Generators use L-by-2 random-access memory (RAM) look-up tables for independent in-phase/quadrature (I/Q) code generation, using length-L arbitrary code sequences; depending on the size of available RAM blocks, and whether the NCO sampling rate is less than the available processing rate, either one RAM block per channel is required to store the PN-sequence, or RAM blocks could be shared between two or more channels, wherein L is an integer.

12. The invention defined in claim 10 including a PN Chip-shaping poly-phase interpolation filter utilizing precisely known PN Code Phase, in conjunction with known past, present, and future PN sequence, in conjunction with anticipated transmitted spectral shaping characteristics, to shape said Matched Filter reference waveform to more closely match the distortions of the incoming signal, thereby reducing correlator implementation loss due to asynchronous sampling of the received signal and single-bit quantization of the reference waveform, particularly for the case of tapping only a single sample per chip.

13. The invention defined in claim 3 wherein a RAM-based architecture exploits high-density implementation in field-programmable gate-arrays (FPGAs) and application-specific integrated circuits (ASICs) by taking advantage of processing rates ($F_{proc}$) much greater than the data sampling rate ($F_{samp}$) and RAM is used for all data shift-registers, Code Generators, and NCOs for efficient hardware utilization; furthermore, due to the processing rate being greater than the data sampling rate, less computation hardware is required, and can be shared to satisfy the needs of multiple stages (basically, reduced according to $F_{samp}/F_{proc}$).

14. The invention defined in claim 3 wherein four or more Channels, and one Band, are allocated to receiving GPS signals and thus deriving periodic time and position calculations, and then utilizing the remaining receiver resources to process another signal of primary interest, and the precise derivation of time, and therefore frequency, from the GPS allows the frequency error inherent to the local reference oscillator to be measured and corrected (to a level approaching the accuracy of the GPS ground station reference over long periods), thus having the potential of significantly improving the receiver performance with regard to the primary signal of interest.

* * * * *